US009947848B2

(12) United States Patent
Sakamoto et al.

(10) Patent No.: US 9,947,848 B2
(45) Date of Patent: Apr. 17, 2018

(54) SEMICONDUCTOR LIGHT EMITTING DEVICE AND METHOD FOR PRODUCING THE SAME

(71) Applicant: NICHIA CORPORATION, Anan-shi (JP)

(72) Inventors: Masahiro Sakamoto, Tokushima (JP); Kazuhide Yanasaka, Anan (JP); Satoshi Shichijo, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/795,892

(22) Filed: Jul. 10, 2015

(65) Prior Publication Data

US 2016/0013378 A1 Jan. 14, 2016

(30) Foreign Application Priority Data

Jul. 11, 2014 (JP) .................................. 2014-143696

(51) Int. Cl.
H01L 33/00 (2010.01)
H01L 33/62 (2010.01)
(Continued)

(52) U.S. Cl.
CPC .............. H01L 33/62 (2013.01); H01L 33/48 (2013.01); H01L 33/54 (2013.01); H01L 33/56 (2013.01);
(Continued)

(58) Field of Classification Search
CPC ......... H01L 33/48; H01L 33/54; H01L 33/56; H01L 33/62; H01L 33/64; H01L 33/005;
(Continued)

(56) References Cited

U.S. PATENT DOCUMENTS 6,054,716 A * 4/2000 Sonobe ................. H01L 25/167
250/552
2002/0121683 A1* 9/2002 Kelly .................. H01L 23/3107
257/675
(Continued)

FOREIGN PATENT DOCUMENTS

EP 2383808 11/2011
JP 08222766 A * 8/1996 ........... H01L 33/483
(Continued)

Primary Examiner — Vongsavanh Sengdara
(74) Attorney, Agent, or Firm — Mori & Ward, LLP

(57) ABSTRACT

A semiconductor light emitting device includes a lead frame 1 covered by a resin package 2. The lead frame 1 includes first and second leads 1A and 1B facing each other. The first and second leads 1A and 1B include inner lead sections 11 and 12 covered with the package 2, respectively. The first and second leads 1A and 1B include outer lead sections 13 protruding from package 2 ends. First and second exposed surfaces 51 and 52 are exposed from the package 2 in the first and second lead lower surfaces, respectively. The first lead 1A is longer than the second lead 1B. An LED 3 is mounted on the first lead upper surface. The second lead 1B includes second end portions 15 extending in the second exposed surface 52 from the both ends of the facing surface toward the first lead 1A.

15 Claims, 9 Drawing Sheets

(51) Int. Cl.
  *H01L 33/48* (2010.01)
  *H01L 33/54* (2010.01)
  *H01L 33/56* (2010.01)
  *H01L 33/64* (2010.01)
(52) U.S. Cl.
  CPC .... *H01L 33/64* (2013.01); *H01L 2224/48247* (2013.01); *H01L 2224/48257* (2013.01); *H01L 2224/73265* (2013.01)
(58) Field of Classification Search
  CPC ............... H01L 33/38; H01L 33/486; H01L 2933/0005; H01L 2224/48247; H01L 2224/48257; H01L 2224/73265; H01L 2924/12041; H01L 23/49541
  USPC ............ 257/81, 99, 672, 692; 438/26
  See application file for complete search history.

(56) References Cited

U.S. PATENT DOCUMENTS

| | | | | |
|---|---|---|---|---|
| 2006/0170083 | A1* | 8/2006 | Kim | H01L 33/62 257/666 |
| 2006/0192224 | A1* | 8/2006 | Ono | H01L 33/54 257/99 |
| 2007/0241342 | A1* | 10/2007 | Inoue | H01L 24/05 257/79 |
| 2008/0237627 | A1 | 10/2008 | Kobayakawa | |
| 2010/0270571 | A1 | 10/2010 | Seo | |
| 2011/0222299 | A1* | 9/2011 | Takahashi | H01L 33/486 362/363 |
| 2011/0248293 | A1* | 10/2011 | Chan | H01L 25/0753 257/89 |
| 2011/0284900 | A1 | 11/2011 | Kim | |
| 2012/0049237 | A1 | 3/2012 | Hata et al. | |
| 2012/0223343 | A1* | 9/2012 | Kang | H01L 25/0753 257/88 |
| 2013/0127034 | A1 | 5/2013 | Hasegawa et al. | |
| 2013/0256733 | A1* | 10/2013 | Lin | H01L 33/62 257/99 |
| 2014/0117403 | A1* | 5/2014 | Hayashi | H01L 33/62 257/99 |
| 2014/0124812 | A1* | 5/2014 | Kuramoto | H01L 33/54 257/98 |

FOREIGN PATENT DOCUMENTS

| | | | |
|---|---|---|---|
| JP | 2820197 B2 * | 11/1998 | ........... H01L 33/483 |
| JP | 2008-251937 | 10/2008 | |
| JP | 2009-65002 | 3/2009 | |
| JP | 2010-283063 | 12/2010 | |
| JP | 2011-505689 | 2/2011 | |
| JP | 2011-233821 | 11/2011 | |
| JP | 2011-249800 | 12/2011 | |
| JP | 2012-049348 | 3/2012 | |
| JP | 2012-209377 | 10/2012 | |
| JP | 2013-004905 | 1/2013 | |
| JP | 2013-236005 | 11/2013 | |
| JP | 2014-017341 | 1/2014 | |
| KR | 101110911 B1 * | 2/2012 | ............. H01L 33/62 |
| WO | WO 2012/014382 | 2/2012 | |

* cited by examiner

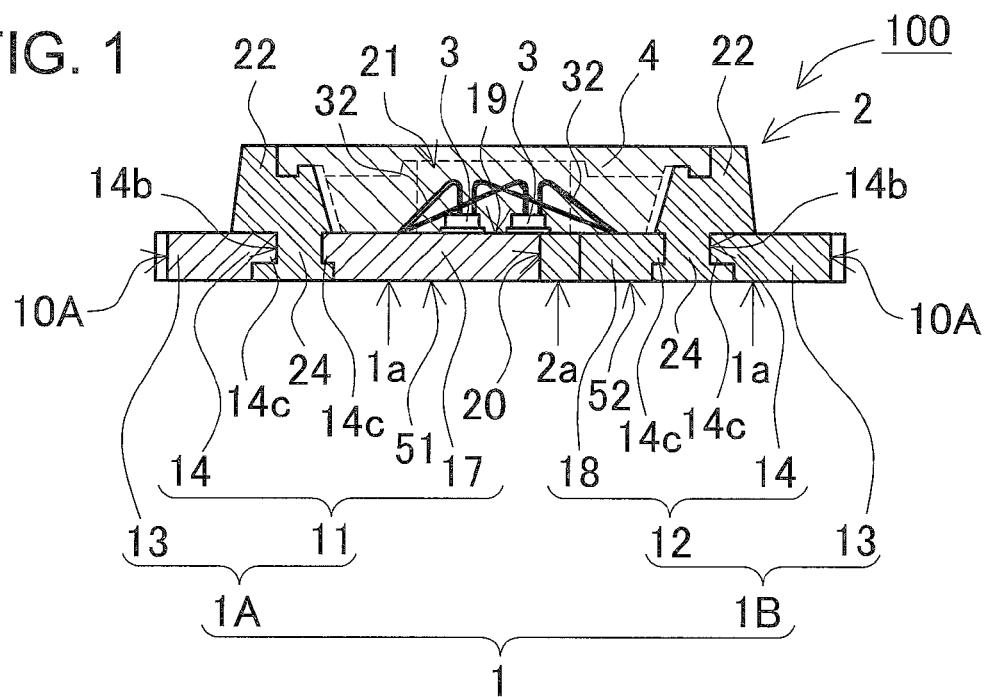
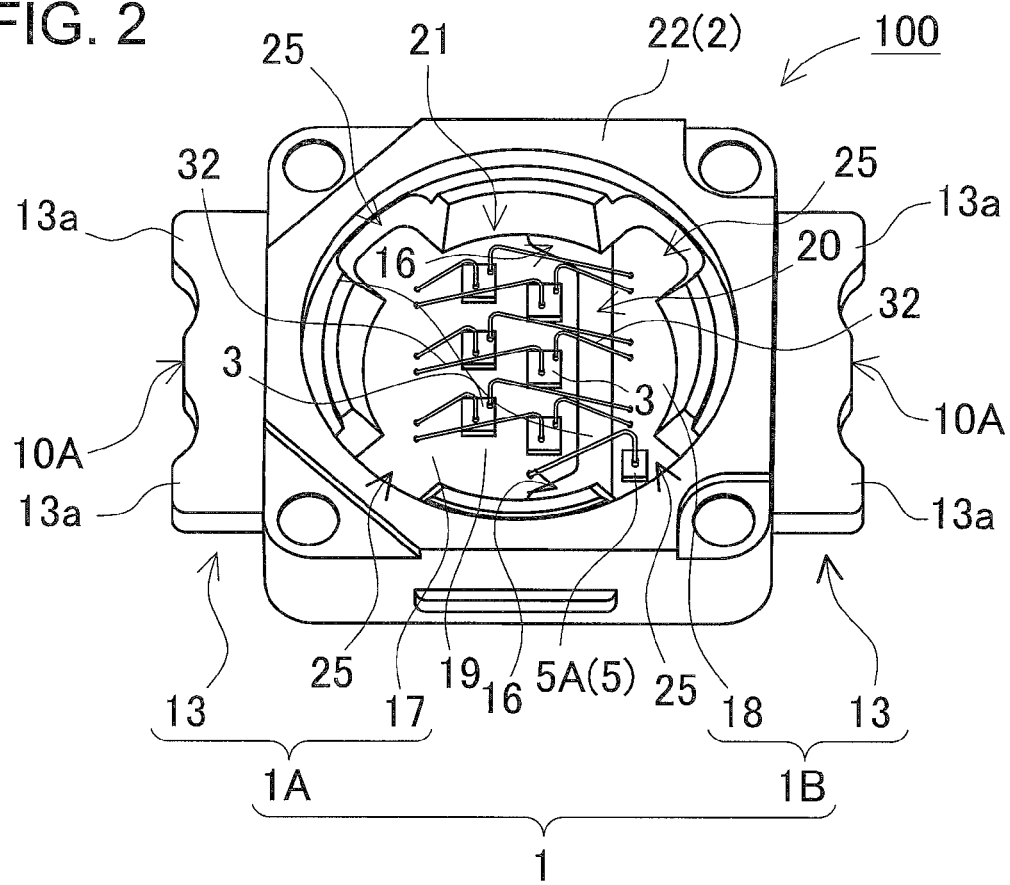

FIG. 9
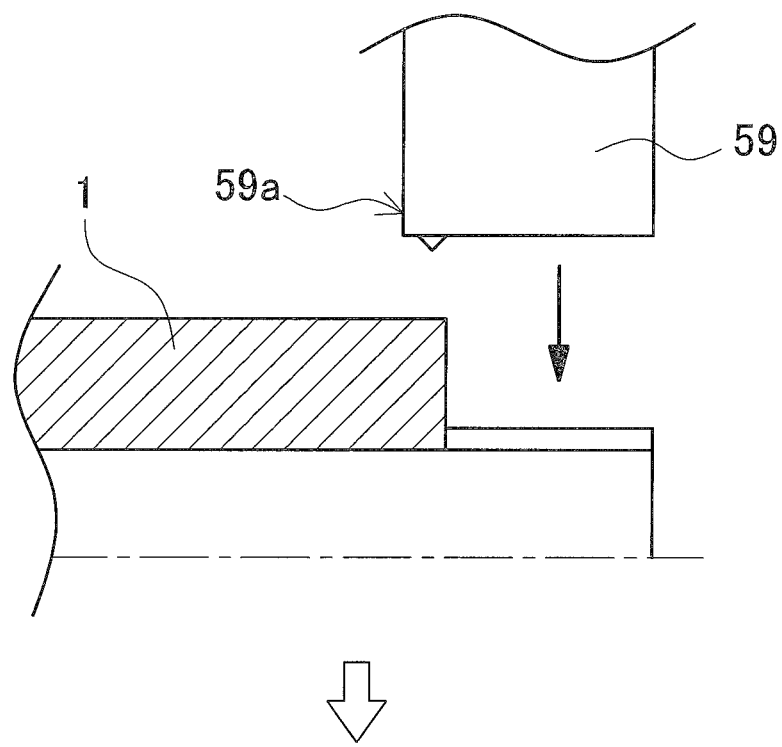
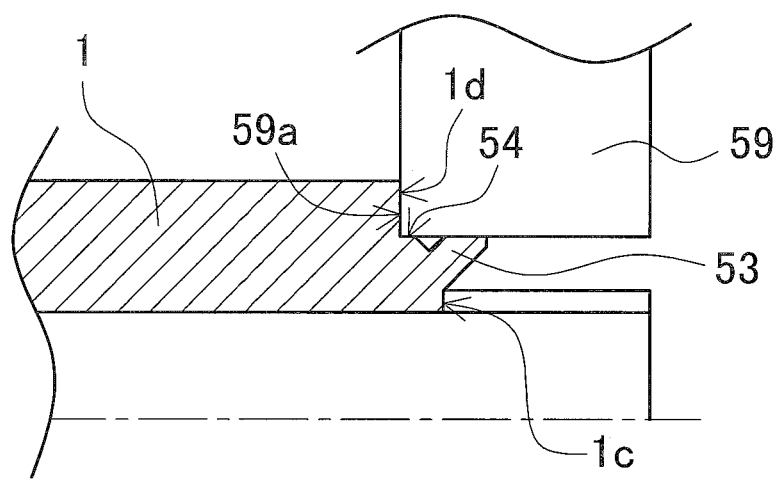

SEMICONDUCTOR LIGHT EMITTING DEVICE AND METHOD FOR PRODUCING THE SAME

CROSS-REFERENCE TO RELATED APPLICATIONS

The present application claims priority under 35 U.S.C. § 119 to Japanese Patent Application No. 2014-143,696, filed Jul. 11, 2014. The contents of this application are incorporated herein by reference in their entirety.

BACKGROUND OF THE INVENTION

1. Field of the Invention

The present invention relates to a semiconductor light emitting device that includes a semiconductor light emitting element such as a light emitting diode, and a method for producing the semiconductor light emitting device.

2. Description of the Related Art

In recent years, semiconductor light emitting devices such as the light emitting diodes (hereinafter also referred to as LEDs), which have low power consumption, are becoming more popular instead of conventional filament lamps in general lighting lamp applications. The applications of semiconductor light emitting devices broaden to light sources for vehicles from lights sources for lighting.

FIGS. 11 and 12 show an example of the semiconductor light emitting device (see WO2012/014,382 A1). This semiconductor light emitting device includes a lead frame 81; a semiconductor element 83 held by the lead frame 81; a frame body 82 formed on the lead frame 81 to surround the semiconductor element 83, cover a side surface of the lead frame 81, and expose a bottom surface of the lead frame 81; and a protective resin (not shown) filling a region surrounded by the frame body. The lead frame 81 includes a die pad section 81A, and a lead section 81B. The die pad section 81A, and the lead section 81B are arranged away from each other and fixed to the lead body 82 so that they are electrically isolated from each other. The die pad section 81A is longer than the lead 81B. The semiconductor element 83 is mounted on the upper surface of the die pad portion 81A having a larger area.

After resin is formed as the frame bodies 82 on the lead frames 81, as shown in FIG. 13, the lead frames 81 are cut from each other along the single-dot-dashed lines in FIG. 13 so that the semiconductor light emitting devices are manufactured. However, in the process for manufacturing the semiconductor light emitting devices, as shown in a bottom view of FIG. 14, a crack 85 may be produced in the peripheral edge part on the lead 81B side, or the like by a shock when cutting the lead frames 81 from each other (see the arrows A in FIG. 12). This crack 85 may cause quality deficiencies, which may lead to reduce the reliability of the semiconductor light emitting element.

See also Laid-Open Patent Publication No. JP 2012-209, 377 A.

It is one object of the present invention to provide a semiconductor light emitting device including a resin package that can be effectively prevented from being damaged by a shock when an external force is applied to a lead frame whereby improving its reliability, and a method for producing the semiconductor light emitting device.

SUMMARY OF THE INVENTION

A semiconductor light emitting device according to an embodiment of the present invention includes a lead frame, a semiconductor light emitting element that is mounted on a mount surface of the lead frame, and a resin package that covers the lead frame. The lead frame includes a first lead and a second lead that are arranged along a facing direction so as to face each other at facing surfaces in the resin package. The first lead forms a first exposed surface in the lower surface that is exposed from the bottom surface of the resin package, and the second lead forms a second exposed surface in the lower surface that is exposed from the bottom surface of the resin package, respectively. The first lead is longer than the second lead in the facing direction. The semiconductor light emitting element is mounted on the upper surface of the first lead. The second lead includes a pair of second end portions in the second exposed surface. The second end portion extends from the both ends of the facing surface toward the first lead in tapered shape.

This construction can reduce the risk that a part of the resin package on the periphery of the second lead, which is shorter than the first lead, is damaged by a shock when an external force is applied to the lead frame in the production process, and the like of the semiconductor light emitting device. Accordingly, the quality of the semiconductor light emitting device can be ensured. As a result, the semiconductor light emitting device can be used with less risk in various applications. In particular, since the second end portion tapers toward the first lead, the size of area required to release the stress when an external force is applied can be surely provided while suppresses an increase of the area of the second end portion.

A method for producing a semiconductor light emitting device according to an embodiment of the present invention includes a lead frame preparation step, a resin package formation step, a mounting step, and a cutting step. The semiconductor light emitting device includes a lead frame, a semiconductor light emitting element, and a resin package.

The semiconductor light emitting element is mounted on a mount surface of the lead frame. The resin package covers the lead frame. The lead frame includes first and second leads that face each other at facing surfaces. The first lead is longer than the second lead in one direction. The second lead includes a pair of second end portions that extend from the both ends of said facing surface toward the first lead in tapered shape.

In the lead frame preparation step, a lead runner including the lead frame is prepared with its both ends being connected to the lead runner through lead connecting portions whereby preparing the lead frame. In the resin package formation step, the resin package is formed by covering the lead frame by a resin with the both ends of the lead frame being arranged outside end surfaces of the resin package to be formed that face each other so that the lower surfaces of the first and second leads are exposed from the bottom surface of the resin package. In the mounting step, the semiconductor light emitting element is mounted onto the lead frame. In the cutting step, the lead connecting portions on the both ends of the lead frame, which is integrally formed with the resin package, is cut whereby separating the lead frame from the lead runner.

This method can reduce the risk that the resin package is damaged by a shock when the lead connecting portions, which are connected to the both ends of the lead frame, are cut in the production process of the semiconductor light emitting device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic vertical cross-sectional view showing a semiconductor light emitting device according to one embodiment of the present invention;

FIG. 2 is a schematic perspective view of the semiconductor light emitting device shown in FIG. 1;

FIG. 9 shows enlarged schematic cross-sectional views illustrating a production process of the lead frame shown in FIG. 8;

DESCRIPTION OF EMBODIMENTS

Figure 3:
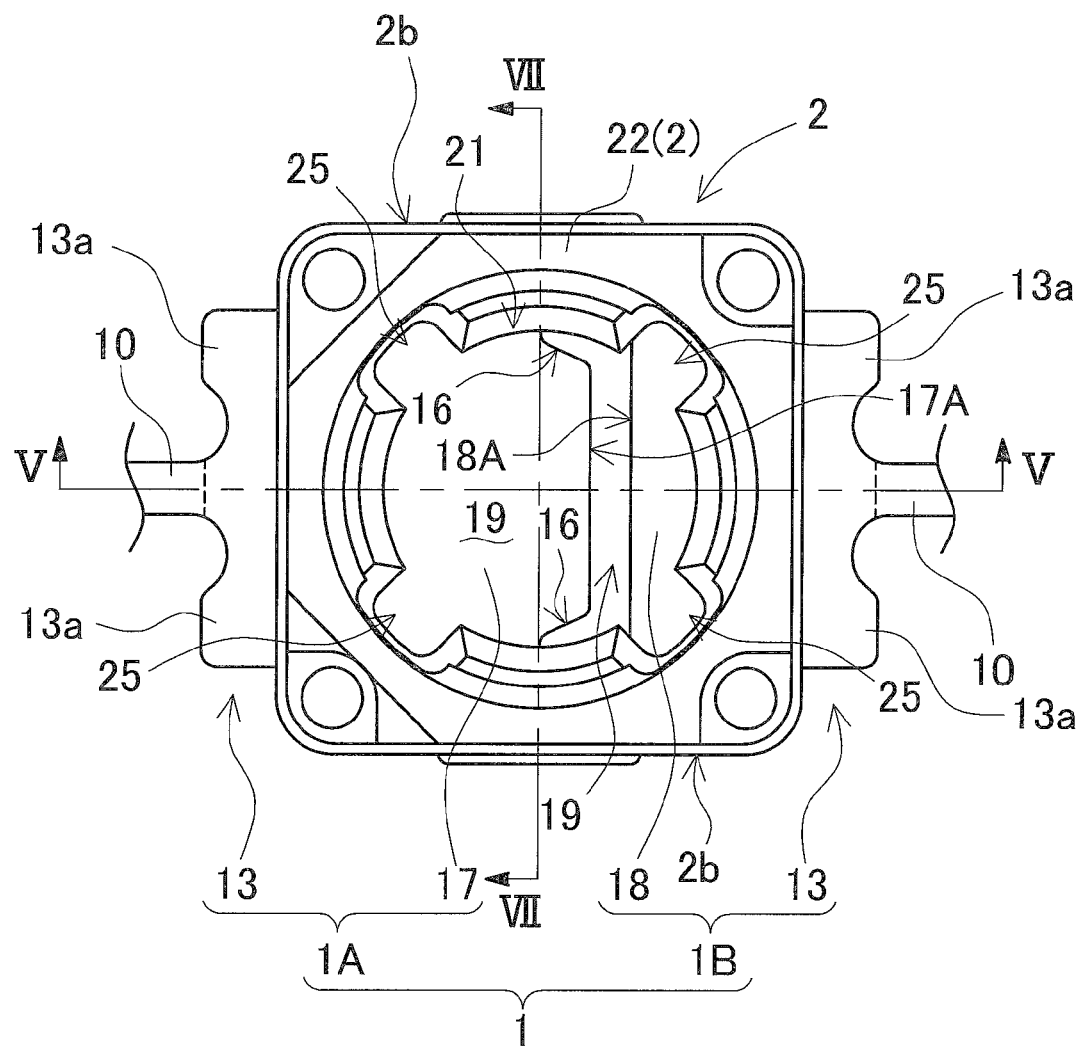
FIG. 3 is a schematic plan view showing a production process of the semiconductor light emitting device shown in FIG. 2 with a resin package being formed on a lead frame.

The embodiments will now be described with reference to the accompanying drawings, wherein like reference numerals designate corresponding or identical elements throughout the various drawings.

It should be appreciated, however, that the embodiments described below are descriptions of a semiconductor light emitting device and a method for producing the semiconductor light emitting device to give a concrete form to technical ideas of the invention, and a semiconductor light emitting device and a method for producing the semiconductor light emitting device of the invention are not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like.

A semiconductor light emitting device according to the embodiment of the present invention includes a lead frame, a semiconductor light emitting element that is mounted on the lead frame, and a resin package that covers the lead frame. The lead frame includes first and second leads that are arranged in the resin package and face each other. Each of the first and second leads includes inner and outer lead sections. The inner lead section is covered by the resin package. The outer lead section is arranged on aside surface of the resin package, and extends from the inner lead section. The first and second leads have first and second exposed surfaces in their lower surfaces that are exposed from the bottom surface of the resin package, respectively. The first lead is longer than the second lead in the facing direction. The semiconductor light emitting element is mounted on the upper surface of the first lead. The second lead includes a pair of second end portions in the second exposed surface. The second end portions extend from the both end parts of the edge that faces the first lead, and taper toward the first lead.

In this specification, the term "covered by the resin package" or the synonymous expressions refers to that at least a part of the outer peripheral surface of the lead frame is in contact with the resin package in a vertical cross-sectional view taken along a direction approximately perpendicular to the facing direction, and is used in a broad sense including that the outer peripheral surface of the lead frame is partially exposed from the resin package.

In the semiconductor light emitting device according to the embodiment of the present invention, the pair of extension sections can have a triangular shape that tapers toward the first lead. According to this construction, the recessed part of on the edge of the first lead that faces the second lead can be small while surely providing the area of the second end portion in the second exposed surface. As a result, it facilitates to surely provide an sufficient area of the mount part of the upper surface of the first lead for mounting the semiconductor light emitting element.

In the semiconductor light emitting device according to a form of the present invention, side surfaces of the resin package that meet the end surfaces of the resin package from which the outer leads of the first and second leads can be covering surfaces that prevent exposure of the lead frame. According to this construction, since the lead frame as an electrically-conducting member of the semiconductor light emitting device protrudes only in one direction from the resin package, the semiconductor light emitting devices can be easily arranged at a small pitch.

In the semiconductor light emitting device according to a form of the present invention, the first lead can have a pair of recessed parts that are arranged on the both side parts, which face the pair of second end portions, of its edge that faces the second lead. In this construction, although the second end portions extend from the both side parts of the edge of the second lead that faces the first lead, the recessed parts are formed on the both side parts of the first lead, which face the second end portions, so that the edges of the first and second leads that face each other can be spaced away from each other over the entire length of the edges. Accordingly, the reliability of electrical insulation between the first and second leads can be ensured. In addition, in the case where the second end portions taper toward the first lead so that the areas of the second end portions are dimensioned small, and the areas of the recessed parts of the first lead are dimensioned small, a sufficient mounting part of the first lead can be surely provided for mounting the semiconductor light emitting element.

In the semiconductor light emitting device according to a form of the present invention, the second lead can include a second intermediate portion that is arranged in the part that faces the first lead and extends approximately straight between the pair of second end portions. In addition to this, the first lead can include a first intermediate portion that is arranged in the part that faces the second lead and extends approximately straight between the pair of recessed parts. According to this construction, the parts of the first and second leads that face each other can be spaced at a certain interval away from each other whereby surely electrically insulating them from each other while suppressing the damage to the peripheral edge part of the resin package on the second lead side. Also, since the central parts of their edges that face each other are straight, the semiconductor light emitting element can be easily arranged.

In the semiconductor light emitting device according to a form of the present invention, the resin package can have an opening on the upper surface side that is recessed as viewed in section so as to expose the upper surface of the lead frame from the resin package in the bottom surface of the opening. The upper surface of the lead frame can serve as the mount surface for the semiconductor light emitting element. In addition to this, the second end portions of the second leads can be covered by the resin package, and the second intermediate portion can be exposed in the bottom surface of the opening. According to this construction, the exposed part of the second lead in the opening of the resin package can be wide while securely fastening the second lead to the resin package by covering the second end portion of the second lead by the resin package. As a result, conductive wires can be easily connected to the semiconductor light emitting element, which is mounted on the first lead.

In the semiconductor light emitting device according to a form of the present invention, the resin package can have an opening on the upper surface side that is recessed as viewed in section so as to expose the upper surface of the lead frame from the resin package in the bottom surface of the opening. The upper surface of the lead frame can serve as the mount surface for the semiconductor light emitting element. In addition to this, the first intermediate portion and the recessed parts of the first lead can be exposed in the bottom surface of the opening. According to this construction, since the recessed part of the first lead is exposed in the bottom surface of the opening of the resin package, the area of the resin package that is exposed in the bottom surface of the opening can be large. Accordingly, in the case where the opening of the resin package is filled with a sealing material such as a resin, since the contact area between the sealing resin and the resin in the bottom surface of the opening can be large, the adhesive strength of the sealing resin can be improved.

In the semiconductor light emitting device according to a form of the present invention, the resin package can have an opening on the upper surface side that is recessed as viewed in section so as to expose the upper surface of the lead frame from the resin package in the bottom surface of the opening, and the upper surface of the lead frame can serve as the mount surface for the semiconductor light emitting element. In addition to this, the semiconductor light emitting element can be mounted on the first lead in the central part of the opening. According to this construction, the balance can be achieved in light emission from the semiconductor light emitting element which is arranged in the central part of the opening, which is formed in the resin package.

In the semiconductor light emitting device according to a form of the present invention, the lead frame can have an overlapping part where the first and second leads overlap each other as viewed from the side surface.

In the semiconductor light emitting device according to a form of the present invention, the first and second leads can include first and second flange portions on their side edges, and the first and second flange portions can be embedded in the resin package. According to this construction, since the resin package covers the first and second flange portions which are included the first and second leads, the coupling strength between the lead frame and the resin package can be improved. In addition, damage to the resin package on the periphery of the lead frame can be effectively prevented.

In the semiconductor light emitting device according to a form of the present invention, the second flange portion, which is arranged in the second lead, can include an extending part that continuously extends from the side edge to the end of the second end portion so as to surround the end of the second end portion. According to this construction, the mechanical strength of the part of the second end portion around its end can be increased. As a result, the damage to the resin package in this part can be effectively prevented.

In the semiconductor light emitting device according to a form of the present invention, inside edges of the pair of second end portions that face each other can be inclined so that the distance between the inside edges can broaden away from the second lead. According to this construction, since the extension direction of the second end portion is inclined outside, the distance of the inclined part can be longer. As a result, there is an effect that can release stresses outside.

In the semiconductor light emitting device according to a form of the present invention, one edge of the second end portion can be an extending line that extends from the side edge of the second exposed surface of the second lead toward the first lead. According to this construction, the second end portion can extend toward the first lead whereby effectively preventing the damage to the resin package on the periphery of the second lead without increasing the width of the second lead, in other words, without increasing the entire shape of the resin package.

In the semiconductor light emitting device according to a form of the present invention, each of the first and second exposed surfaces can continuously extend from the inner lead section to the outer lead section. According to this construction, since the exposed surface of the lead frame, which is exposed in the bottom surface of the resin package, can be continuously extend as one surface from the inner lead section to the outer lead section, there is an effect that improves the heat dissipation characteristics of the semiconductor light emitting device.

In the semiconductor light emitting device according to a form of the present invention, the first and second exposed surfaces can be coplanar with the bottom surface of the resin package. According to this construction, the first and second exposed surfaces of the first and second leads can be used as external connection surfaces, and be electrically connected to the surface of a base member such as a circuit board. In particular, since the lower surface of the lead frame is coplanar with the bottom surface of the resin package, the lower surface of the lead frame can be brought in intimate contact with the surface of the base member. As a result, the lead frame can be suitably electrically connected to the base member.

In the semiconductor light emitting device according to a form of the present invention, a protection element for protecting the semiconductor light emitting element can be mounted on the second lead. According to this construction, the semiconductor light emitting element can be protected by the protection element such as a Zener diode which is mounted on the second lead.

A method for producing a semiconductor light emitting device according to a form of the present invention includes a lead frame preparation step, a resin package formation step, a mounting step, and a cutting step. The semiconductor light emitting device includes a lead frame, a semiconductor light emitting element, and a resin package. The semiconductor light emitting element is mounted on the lead frame. The resin package covers the lead frame. The lead frame includes first and second leads that face each other. The first lead is longer than the second lead in the facing direction that is perpendicular to the edges of the first and second leads that faces each other. The second lead includes a pair of second end portions that extend from the both side parts of the edge that faces the first lead, and taper toward the first lead. In the lead frame preparation step, a lead runner including the lead frame is prepared with its both ends being connected to the lead runner through lead connecting portions whereby preparing the lead frame. In the resin package formation step, the resin package is formed by covering the lead frame by resin with the both ends of the lead frame being arranged outside end surfaces of the resin package to be formed that face each other so that the lower surfaces of the first and second leads are exposed from the bottom surface of the resin package. In the mounting step, the semiconductor light emitting element is mounted onto the lead frame. In the cutting step, the lead connecting portions on the both ends of the lead frame, which is integrally formed with the resin package, is cut whereby separating the lead frame from the lead runner.

In the method for producing a semiconductor light emitting device according to a form of the present invention, a frame unit that includes a plurality of lead frames that are arranged in one or more rows and connected to the lead runner can be prepared in the preparing a lead runner including the lead frame. According to this method, since the resin can be formed on a number of lead frames which are coupled to the lead runner, the semiconductor light emitting devices can be efficiently produced in a high-volume production manner.

A semiconductor light emitting device 100 according to an embodiment of the present invention is now described with reference to FIGS. 1 to 7. FIG. 1 is a schematic vertical cross-sectional view of the semiconductor light emitting device. FIG. 2 is a schematic perspective view of the semiconductor light emitting device shown in FIG. 1. FIGS. 3, 4, 5, 6 and 7 are schematic plan, bottom, vertical widthwise cross-sectional, horizontal cross-sectional, and vertical lengthwise cross-sectional views, respectively, showing a production process of the semiconductor light emitting device shown in FIG. 1. The illustrated semiconductor light emitting devices 100 is a surface mount type semiconductor light emitting device. The semiconductor light emitting device 100 includes a lead frame 1 formed of an electrically-conductive material, semiconductor light emitting elements 3 mounted on the lead frame 1, and an electrically insulating resin package 2 covering the lead frame 1.

In the illustrated semiconductor light emitting device 100, the resin package 2 covers the upper surface of the lead frame 1. The illustrated resin package 2 has an opening 21 on the upper surface side that is recessed as viewed in section so as to expose the upper surface of the lead frame 1 from the resin package in the bottom surface of the opening 21. The upper surface of the lead frame 1 serves as the mount surface 19 for the semiconductor light emitting elements. The semiconductor light emitting elements 3 are mounted on the mount surface 19. In the semiconductor light emitting device 100 shown in FIG. 1, the opening 21 of the resin package 2 in which the semiconductor light emitting elements 3 are mounted is filled with a sealing member 4. The semiconductor light emitting device according to the embodiment of the present invention includes the lead frame 1 having a particular shape the surface of which is covered by the resin package 2 with being arranged in a predetermined position. Accordingly, any semiconductor light emitting elements and any sealing members which have been already developed and will be developed in the future can be used as the semiconductor light emitting elements 3 to be mounted on the lead frame 1, and the sealing member 4 to be accommodated in the opening 21 of the resin package 2. The following description will describe members of the semiconductor light emitting device according to this embodiment.

(Lead Frame 1)

The lead frame 1 is formed from an electrically-conductive metal plate into a predetermined shape. The entire shape of the lead frame 1 shown in FIGS. 1 to 8 is a belt shape. The both side edges are approximately parallel to each other. Various types of metals can be used for the electrically-conductive metal plate from which the lead frame 1 is formed. Examples of the metals can include copper, copper alloys, and iron alloys such as stainless steel and invar. The electrically-conductive metal plate can be made of a clad material which made of different metal. In addition, the lead frame 1 can may have a plated layer on its mount surface for the semiconductor light emitting elements 3, connection parts to be connected to exterior terminals, and the like. Any types of plating materials can be used for the plated layer. The plated layer can be formed by any types of known plating methods. Preferably, the plated layer contains one or more elements selected from the group consisting of silver, gold, nickel, aluminum, palladium, rhodium, and copper. More preferably, the plated layer mainly contains one or more elements selected from the group consisting of silver, nickel, palladium, and gold. In particular, the uppermost surface lead frame on which the semiconductor light emitting elements are mounted preferably includes a plated layer containing silver as high reflective material for light from the light emitting elements, or gold having good adhesive strength for wires.

The lead frame 1 includes first and second leads 1A and 1B that are arranged in the resin package 2 and face each other. The lead frame 1 constructed of the first and second leads 1A and 1B is partially covered by the resin package 2 so that the lead frame is held in place by the resin package 2. The first lead 1A includes an inner lead section 11 that is covered by the resin package 2, and an outer lead section 13 that extends from the inner lead section 11 and protrudes from an end surface of the resin package 2. The second lead 1B includes an inner lead section 12 that is covered by the resin package 2, and another outer lead section 13 that extends from the inner lead section 12 and protrudes from another end surface of the resin package 2. The both end parts of the illustrated lead frame 1 protrude from the resin package 2. The end parts which protrude from the end surfaces of the resin package 2 are the outer leads 13, and can be connected to the exterior terminals. The illustrated lead frame 1 has a width (W) which is defined by the distance between both side edges and shorter than the width of the resin package 2, and a length which allows its both ends to extend outside the resin package 2, in other words, protrude from the both end surfaces of the resin package 2. That is, side surfaces of the resin package 2 that meet other side surfaces of the resin package from which the outer leads 13 serve as covering surfaces 2b that prevent exposure of the lead frame 1.

Also, the illustrated lead frame 1 has a lower surface 1a which is exposed from a bottom surface 2a of the resin package 2, and the mount surface 19, which is exposed in the bottom surface of the opening 21 of the resin package 2, for mounting the semiconductor light emitting elements 3. That is, the resin package 2 covers the lead frame 1 except for the both end parts, the lower surface 1a, and parts of its upper surface. As discussed above, the inner lead sections 11 and 12 are sections of the lead frame 1 that has at least a part of outer peripheral surfaces in the widthwise cross-sectional view of the lead frame that is in contact with the resin package 2. In other words, at least one of the upper, lower and both side surfaces of the inner lead section of the lead frame 1 are at least partially covered by the resin package 2.

Figure 4:
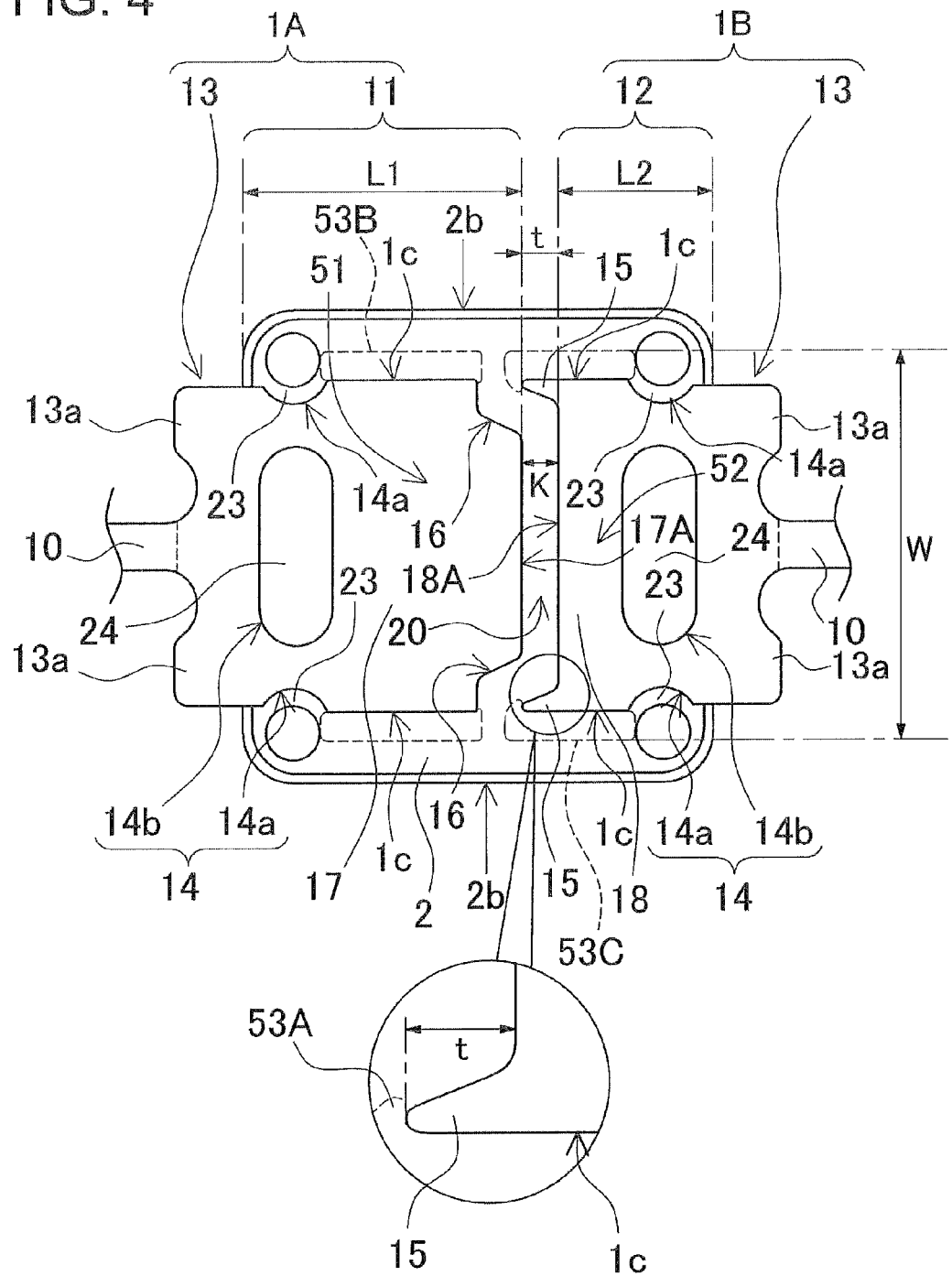
FIG. 4 is a schematic bottom view showing the lead frame and the resin package shown in FIG. 3.

The first lead 1A is longer than the second leads 1B in the length direction of the lead frame 1, that is, in the direction that the first and second leads 1A and 1B face each other. In other words, in the lead frame 1, as shown in FIG. 4, the length (L2) of the inner lead section 12 of the second lead 1B is shorter than the length (L1) of the inner lead section 11 of the first lead 1A. Accordingly, as for the facing part where the edges of the first and second leads 1A and 1B of the lead frame 1 shown in FIGS. 1 to 8 that faces each other, the facing part is deviated from the central part in the opening 21 of the resin package 2. More specifically, the facing part between the first and second leads 1A and 1B of the lead frame 1 shown in FIGS. 1 to 8 is deviated toward the second lead 1B side (right side in FIGS. 1 to 6). The semiconductor light emitting elements 3 are arranged in the central part of the opening 21 on the upper surface of the first lead 1A as shown in FIGS. 1 and 2. The facing edges of the first and second leads 1A and 1B are spaced at a predetermined interval from each other so that an insulation gap 20 is provided between them. The insulation gap 20 is filled with resin whereby electrically insulating the first and second leads from each other.

The first lead 1A extends from an area including the central part of the resin package 2 to one end. More specifically, the first lead 1A is constructed of the inner lead section 11 covered by the resin package 2, and the outer lead section 13 protruding outward of the resin package 2 as a terminal to be connected to the external terminal. The inner lead section 11 of the first lead 1A is arranged in the central part of the opening 21. The inner lead section 11 includes a lead central part 17, and a resin coupling part 14. The semiconductor light emitting elements 3 are mounted on the lead central part 17. The resin coupling part 14 is arranged between the lead central part 17 and the outer lead section 13, and serves to improve the coupling strength between the first lead 1A and the resin package 2. The lead central part 17 of the first lead 1A shown in FIGS. 1 and 2 is exposed in the opening 21 of the resin package 2, and serves as the mount surface 19. The semiconductor light emitting elements 3 are mounted on the mount surface 19. The semiconductor light emitting element 3 mounted on the first lead 1A includes a pair of electrodes on the light emitting surface side. A conductive wire 32 that is connected to one electrode is electrically connected to the lead central part 17 of the first lead 1A, while another conductive wire 32 that is connected to another electrode is electrically connected to the second lead 1B, which faces the first lead. The semiconductor light emitting device 100 shown in FIG. 2 includes six semiconductor light emitting elements 3. It should be noted that the semiconductor light emitting device can have one to five semiconductor light emitting devices, or seven or more semiconductor light emitting elements.

The second lead 1B is arranged on an end part of the resin package 2 on one side opposite to the first lead 1A. More specifically, the second lead 1B is constructed of the inner lead section 12 covered by the resin package 2, and the outer lead section 13 protruding outward of the resin package 2 as a terminal to be connected to the external terminal. The inner lead section 12 of the second lead 1B includes a lead connection part 18, and a resin coupling part 14. The lead connection part 18 is arranged on one end part of the inner lead section 12 that faces the first lead 1A. The resin coupling part 14 is arranged between the lead connection part 18 and the outer lead section 13, and serves to improve the coupling strength between the first lead 1A and the resin package 2. The lead connection part 18 of the second lead 1B shown in FIGS. 1 and 2 is exposed in the opening 21 of the resin package 2. The conductive wire 32 that is connected to another electrode of the semiconductor light emitting element 3 mounted in the first lead 1A is electrically connected to the lead connection part 18.

The outer lead sections 13, which protrude from the resin package 2, and the resin coupling parts 14, which serve to improve the coupling strength, of the illustrated first and second leads 1A and 1B are the same structure.

The outer lead section 13 includes external lead protruding parts 13a that have a approximately convex shape protruding in the length direction of the lead frame 1, and extend coplanar with each other. In the embodiment shown FIG. 2, the external lead protruding parts 13a are located on the both side parts of the outer lead section 13. The corner of the illustrated external lead protruding part 13a is rounded. In addition, the outer lead section 13 is coupled to a lead connection portion 10 that protrudes outward between the external lead protruding parts 13a as shown in FIGS. 3 to 6, and 8. The first and second leads 1A and 1B are coupled to a lead runner 60 discussed below (see FIG. 10) through the lead connection portions 10. FIGS. 1 and 2 show the semiconductor light emitting device after the lead connection portions 10 are cut. The lead connection portion 10 is cut in a cutting process which is one of the production processes.

In addition, the first and second leads 1A and 1B of the illustrated semiconductor light emitting device 100 have first and second exposed surfaces 51 and 52, respectively, which are the lower surfaces 1a exposed from the bottom surface 2a of the resin package 2. The first and second exposed surfaces 51 and 52 of the first and second leads 1A and 1B, which are exposed from the bottom surface 2a of the resin package 2, are coplanar with the bottom surface 2a of the resin package 2. In the lead frame 1 shown in FIGS. 4 and 5, the exposed lower surfaces 1a of the lead frame 1, which are exposed from the bottom surface 2a of the resin package 2, continuously extend from the inner lead sections 11 and 12, which are covered by the resin package 2, to the outer lead sections 13. According to this construction, the first and second exposed surfaces 51 and 52 of the first and second leads 1A and 1B can be used as external connection surfaces, and be electrically connected to the surface of a base member such as a circuit board. Also, since each exposed lower surface of the lead frame 1 continuously extends as one surface from the inner lead section 11 or 12 to the outer lead section 13, there is an effect that improves the heat dissipation characteristics of the semiconductor light emitting device.

The resin coupling parts 14 can have asperities that are formed on their surfaces, openings, and the like. Accordingly, the lead frame 1 can be firmly coupled to the resin package 2 through the resin coupling parts when covered by the resin package 2. The resin coupling part 14 shown in FIGS. 4 to 6 has cut-off parts 14a on its both sides, and a through-hole 14b in its central area. More specifically, the lead frame 1 can be firmly coupled to the resin package 2 through the cut-off parts 14a and the through-hole 14b of the resin coupling part 14. The resin coupling parts may have protruding parts, protruding strips, recessed parts, and the like instead of the cut-off parts and the openings for the improvement of the coupling strength between the lead frame and the resin package.

In addition, the second lead 1B includes second end portions 15 that are located in the second exposed surface 52, and extend toward the first lead 1A from the both side parts of the edge of the second lead that faces the first lead 1A as shown in FIG. 4 in order to prevent the resin package 2 from being damaged by a shock when an external force is applied to the lead frame 1. When an external force is applied to the lead frame 1, since the second lead 1B is shorter than the first lead 1A, the stress caused by the external force is likely to be applied to the second lead. For this reason, the parts of the resin package 2 on the periphery of the second lead 1B are relatively likely to be damaged as compared to other parts. In the semiconductor light emitting device according to this embodiment of the present invention, the corner parts of the shorter second lead 1B that face the first lead 1A extend toward the first lead 1A. As a result, the stress can be dispersed in the cutting process. Consequently, it is possible to reduce the risk that the resin package 2 is damaged.

Figure 6:
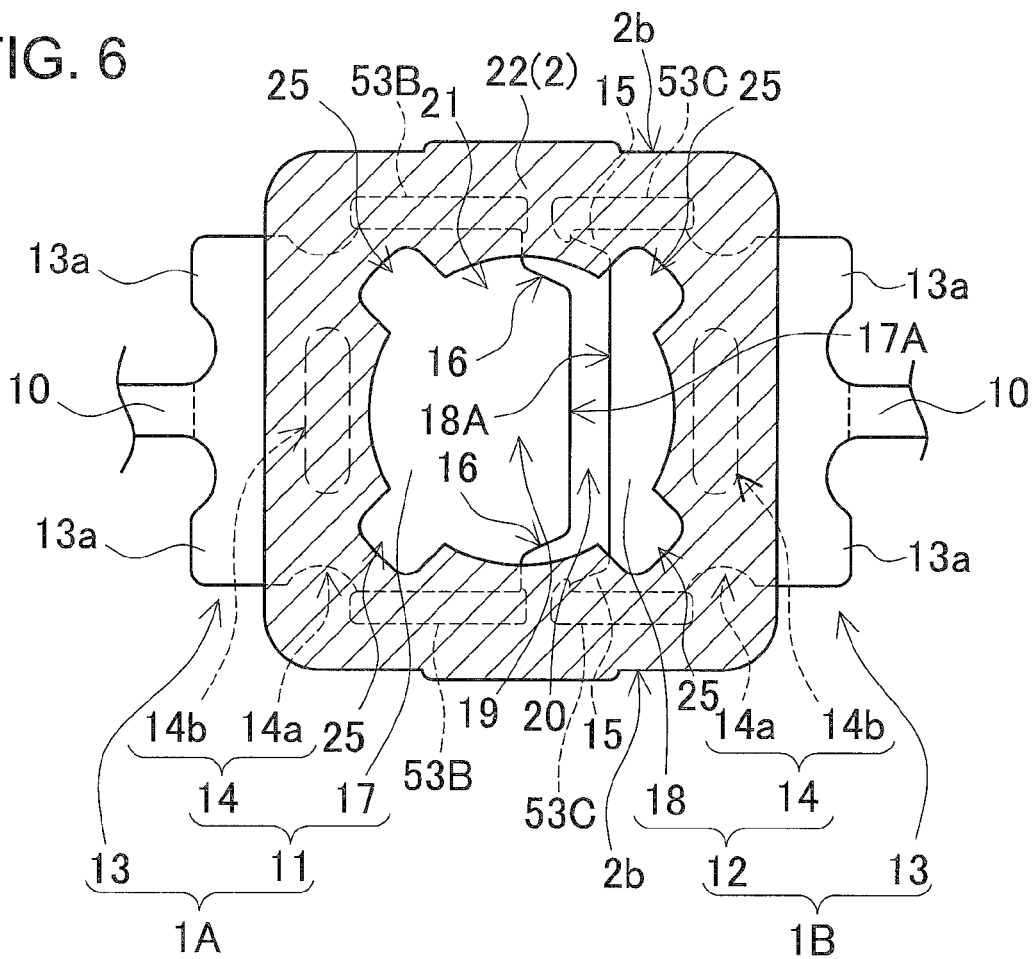
FIG. 6 is a schematic cross-sectional view showing the lead frame and the resin package shown in FIG. 5 taken along the line VI-VI.

In addition to the second end portions 15, which are arranged on the both side parts of the edge that faces the first lead 1A, the second lead 1B shown in FIGS. 4 and 6 includes a second intermediate portion 18A that extends approximately straight between the second end portions 15. Since the second end portions 15 is provided on the both side parts of the facing edge of the second lead 1B, the both side parts of the second lead 1B can be covered by a larger area of the resin package 2. Here, as the area (t) of the second end portion 15 of the second lead 1B becomes larger, that is, as the area of the part of the resin package 2 that covers the both side parts of the second lead 1B becomes larger, the damage to the peripheral edge part of the resin package on the second lead side can be more effectively reduced. However, if the second end portion 15 is increased in the width direction of the lead frame 1 in order to increase the area of the second end portion 15, the width of the lead frame 1 correspondingly becomes larger. Correspondingly, the exterior shape of the resin package 2 for covering the wide lead frame necessarily becomes larger. Accordingly, the entire shape of the semiconductor light emitting device cannot be small. As a result, the amount of the resin to be used will increase. Consequently, the production cost will be higher. Also, when an external force is applied to the outer lead section 13 of the second lead 1B in the vertical direction, the stress is likely to be concentratedly applied to the facing edge of the second lead 1B, which is opposite to the outer lead section 13. In consideration of rotation moment in the vertical direction, the stress applied to the facing edge of the second lead 1B can be more effectively reduced by extending the second end portion 15 toward the first lead 1A as compared with by extending the second end portion 15 in the width direction of the lead frame 1. The reason is that the magnitude of the stress by the rotation moment is inversely proportional to the distance from the rotational center. For this reason, it is preferable that the area (t) of the second end portion 15 provided in the second lead 1B be increased by extending the length of the second end portion 15 toward the first lead 1A. However, the facing edges of the first and second leads 1A and 1B are necessarily to be spaced at a predetermined interval away from each other in order to electrically insulate the first and second leads 1A and 1B from each other. In the case where the area (t) of the second end portion 15 which extends from the second lead 1B toward the first lead 1A is increased, the facing edge of the first lead 1A that faces the second end portion 15 is necessarily retracted by a large amount. In this case, the lead central part 17 of the first lead 1A becomes narrower so that the area of the lead central part 17 is reduced. Since the semiconductor light emitting elements 3 are mounted on the lead central part 17 of the first lead 1A, it is not preferable that the area of the lead central part 17 be reduced. Therefore, the shape, the area, and the like of the second end portion 15 provided in the second lead 1B are determined in consideration of these requirements.

The width of the second end portion 15 shown in FIGS. 4 and 6 gradually decreases toward the first lead 1A. The second end portion 15 has a tapered shape. More specifically, inside edges of the pair of second end portions 15 that face each other are inclined so that the distance between the inside edges increases away from the second lead 1B. The tapered shape of the second end portion 15 shown FIG. 4 is approximately triangular as viewed in plan view. One edge of the approximately triangular-shaped second end portion 15 corresponds to an extending line that extends from the side edge 1c of the second exposed surface 52 toward the first lead 1A. Other edge of the approximately triangular-shaped second end portion 15 corresponds to the inside edge of one of the second end portions 15 that faces the inside edge of another second end portion 15 and is inclined whereby forming divergent space defined by the inside edges. That is, this second lead 1B can have the second end portions 15 extending toward the first lead 1A without increasing its width (W). Accordingly, it is possible to reduce the risk of the damage to the resin package 2 on the periphery of the second lead 1B without increasing the external dimensions of the resin package 2. However, the second end portion of the second lead may extend in the width direction of the lead frame within the exterior shape limits of the resin package. In other words, the width of the second lead between the side edges of the second end portions can be slightly greater than the width of the second lead in the central area of the lead connection part.

Also, in the illustrated second lead 1B, since one edge of the second end portion 15 corresponds to the extending line which extends from the side edge 1c, and the width of the second end portion 15 gradually decreases in the extension direction, the area (t) of the second end portion can be large but the area of the end part of the second end portion 15 can be small. Therefore, there is an advantage that the retracted part of the facing edge of the first lead 1A can be small so that the lead central part 17 of the first lead 1A can surely have a sufficient area. However, the shape of the second end portion is not limited to approximately triangular shapes. The second end portion can have various shapes having a width that decreases in the extension direction, for example, approximately trapezoidal shapes.

In addition, the end of the second end portion 15 is rounded. The second end portion 15 shown in the partially enlarged view of FIG. 4 is rounded so that the edges in the end part of the second end portion are curved. The second end portion 15 having this shape can effectively prevent that the stress is concentrated on the boundary part between its end and the resin package 2. For this reason, the rounded second end portion 15 can more effectively reduce the risk of the damage to the resin package 2.

In addition, the first lead 1A has recessed parts 16 that face the second end portions 15 in the end of the first lead 1A that faces the second lead 1B. Again, the second end portions 15 are arranged on the both side parts of the facing edge of the second lead 1B shown in FIGS. 4 and 6. Correspondingly, the recessed parts 16 are arranged on the both side parts of the facing edge of the first lead 1A that face the second end portions 15. The recessed part 16 has a retracted shape the outline of which is obtained by inwardly retracting the corner of the illustrated first lead 1A that faces the second end portion 15. The facing edges of the first and second leads 1A and 1B are necessarily to be spaced at a predetermined interval away from each other in order to electrically insulate the first and second leads 1A and 1B from each other. Since the recessed parts 16 are arranged on the both side parts of the first lead 1A that face the second end portions 15 of the second lead 1B as discussed above, the first and second leads 1A and 1B can be spaced at a predetermined interval away from each other whereby surely electrically insulating them although the second end portions are formed.

The shape and the size of the recessed part 16 formed in the first lead 1A are designed depending on the second end portion 15 which faces this recessed part 16. That is, when the second end portion 15 of the second lead 1B is large, the recessed part 16 of the first lead 1A which faces this second end portion 16 is required to be large. The reason is to form an insulation gap 20 having a certain interval between the facing edges of the first and second leads 1A and 1B. On the other hand, if the recessed part 16 of the first lead 1A is large as stated above, the area of the lead central part 17 of the first lead 1A is reduced, which in turn may limit the mounting arrangement of the semiconductor light emitting elements 3. Generally, in semiconductor light emitting devices that have semiconductor light emitting elements, positional deviation of the light emitting elements will cause deviation of optical axis of the light emitting device. For this reason, it is preferable that the semiconductor light emitting elements be mounted on the mount surface of the lead central part. Therefore, the recessed part of the first lead is preferably small so that the lead central part can surely have a sufficient area. From this viewpoint, the recessed part 16 is designed as small as possible while forming the insulation gap 20 having the predetermined interval between the second end portions 15 and the recessed part 16. The opening width of the recessed part 16 shown in FIGS. 4 and 6 gradually decreases toward the outer lead section 13 from the opening edge of the recessed part which faces the second lead 1B. The recessed parts 16 of the illustrated first lead 1A are formed so that the lead central part 17 is formed in an isosceles trapezoid-shape which has facing edges of the lead central part that face each other and have the same length, and diverge from the second lead 1B side toward the outer lead section 13 side. According to this construction, the first lead 1A can surely have sufficient space to hold the semiconductor light emitting elements 3 in the central part of the lead central part 17. In the illustrated lead frame 1, the second end portion 15 arranged in the second lead 1B has a approximately triangular shape, while the recessed part 16 which faces this second end portion has approximately trapezoidal shape as viewed in plan view so that the predetermined interval is provided between their facing edges which face each other. However, the recessed part does not necessarily have a approximately trapezoidal shape. The recessed part can have various shapes that can provide the predetermined interval between the facing edges of the recessed part and the second end portion.

The first lead 1A shown in FIG. 4 includes a first intermediate portion 17A that extends approximately straight between the recessed parts 16 in the part of the first lead that faces the second lead 1B. In the lead frame 1 shown in FIG. 4, the first and second intermediate portions 17A and 18A of the first and second leads 1A and 1B have approximately straight lines approximately parallel to each other so that the predetermined interval (K) is provided between them. According to this construction, the first and second leads 1A and 1B can be electrically insulated from each other by spacing them at a certain interval away from each other.

Figure 7:
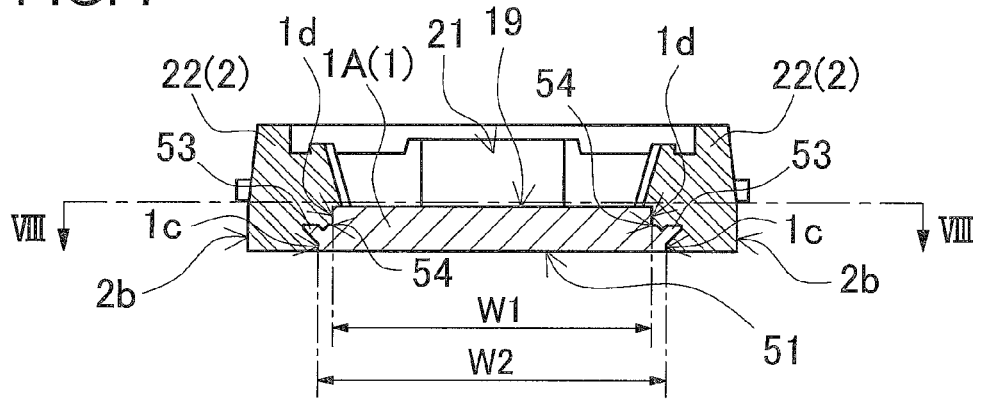
FIG. 7 is a schematic cross-sectional view showing the lead frame and the resin package shown in FIG. 3 taken along the line VII-VII.

In addition, the first and second leads 1A and 1B include first and second flange portions 53B and 53C on their side edge parts, as shown in FIGS. 4, and 6 to 8. The first and second flange portions 53B and 53C are embedded in the resin package 2. Each of the first and second flange portions 53B and 53C is thinner than other parts of the lead frame 1, and protrude outward of the side surfaces of the lead frame 1. More specifically, the flange portion 53 protrudes outward of the middle of the side surface of the lead frame 1 as shown in FIG. 7. Thus, the flange portion 53 is embedded in the resin package 2 so that the upper and lower surfaces of the flange portion are covered by the resin. Since the lead frame 1 includes the flange portions 53 thinner than the lead frame 1, the coupling strength between the lead frame and the resin package 2 can be increased by entirely embedding the flange portion in the resin package 2.

The flange portion 53 shown in FIG. 7 which protrudes from the side surface of the lead frame 1 can be formed by pressing and deforming the side edge part of the plate-shaped lead frame 1 in a press forming manner. For example, as shown in FIG. 9, the upper surface of the both side parts of the lead frame 1 can be pressed by a press die 59 so that the corner part of the lead frame is deformed whereby moving the volume of the deformed part outward. Thus, the flange portion 53 protruding outward can be formed. The lead frame 1 shown in FIG. 9 is pressed by the press die 59 with an inside edge 59a of the press die being positioned inside the side edge 1c located on the lower surface side of the lead frame 1 (i.e., the side edge 1c of the exposed surface). As a result, a stepped part 54 is formed on the side edge part on the upper surface side of the lead frame. Thus, the flange portion 53 protruding outward is formed. In the lead frame 1 shown in FIG. 7, the width (W1) of the interval between the both side edges 1d on the upper surface side is narrower than the width (W2) of the interval between the both side edges 1c on the lower surface side. On the other hand, it should be noted that the lead frame may be pressed in the inverse orientation, that is, the lower surface of the lead frame may be pressed by the press die with an inside edge of the press die being positioned inside the side edge located on the upper surface side of the lead frame whereby forming a stepped part on the side edge part on the lower surface side of the lead frame so that the interval between the both side edges on the upper surface side is wider than the interval between the both side edges on the lower surface side. Also, the side edge of the lead frame may be pressed by a pair of press dies from the upper and lower sides whereby forming a flange portion protruding outward of the middle of the side surface of the lead frame so that the interval between the both side edges on the upper surface side is equal to the interval between the both side edges on the lower surface side.

Figure 8:
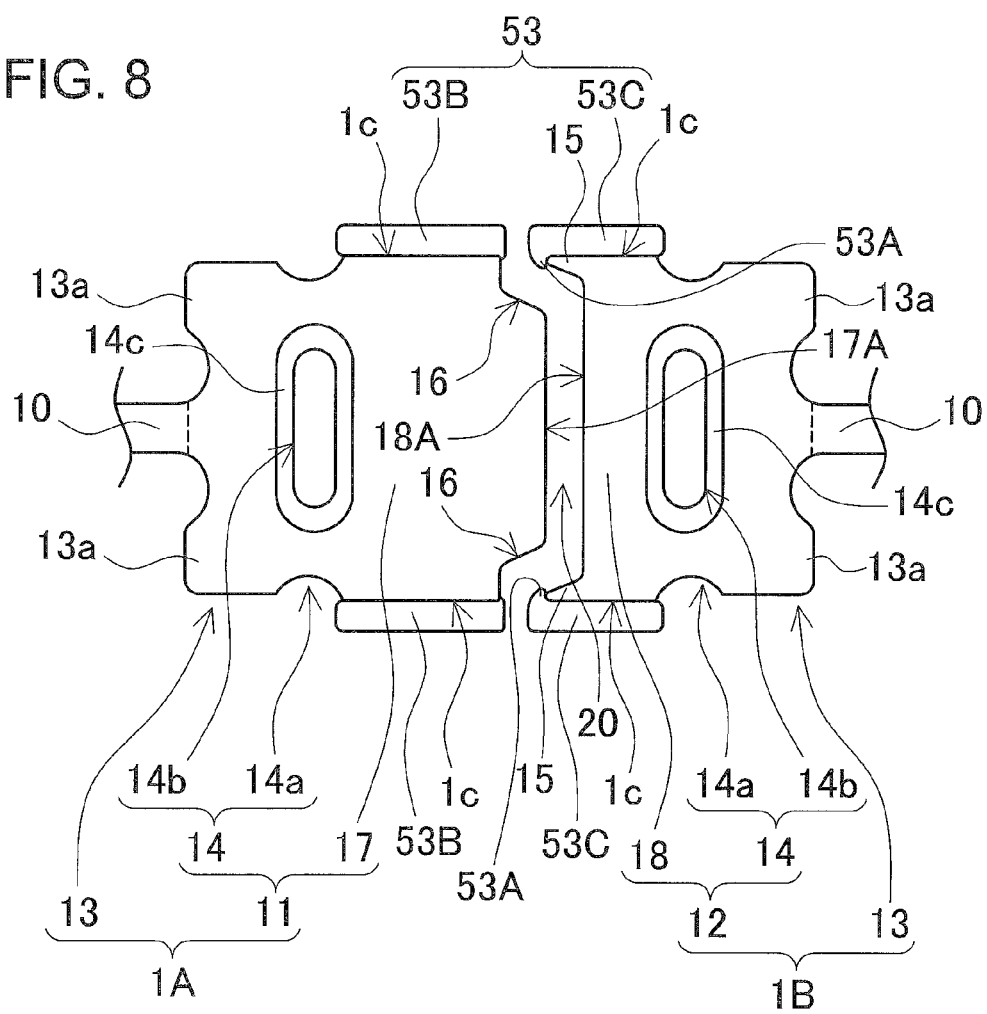
FIG. 8 is a schematic bottom view of the lead frame.

The lead frame 1 shown in FIGS. 7 and 8 includes the first and second flange portions 53B and 53C which protrude outward along the both side edges 1c of the first and second exposed surfaces 51 and 52 of the first and second leads 1A and 1B. The first flange portions 53B of the first lead 1A extend along the both side edges 1c of the parts that are the side edges of the lead central part 17 except for the recessed parts 16. The second flange portions 53C of the second lead 1B extend along the both side edges 1c of the lead connection part 18 and the both side edges 1c of the second end portions 15. In addition, the second flange portion 53C of the second lead 1B further extends along the end of the second end portion 15 as shown in FIG. 8. In other words, the second flange portion 53C of the second lead 1B includes an extending part 53A as its end part on the first lead frame portion 1A that continuously extends from the side edge to the end edge of the second end portion so as to surround the end of the second end portion, in addition to its other parts which extends along the side edge 1c of the second end portion 15. The extending part 53A is formed so as to extend along the end edge of the second end portion 15. The coupling strength between the second end portion 15 and the resin package 2 can be further increased by the second flange portion 53C, which extends along the end edge of the second end portion 15 as discussed above. However, the extending part of the second flange portion of the second lead does not necessarily extend from the side edge along the end edge of the second end portion. The second lead may have the second flange portion that extends only along the side edge of the second end portion.

The extending part 53A of the flange portion 53 shown in FIGS. 4 and 8 is arranged inside the recessed part 16. The lead frame 1 includes an overlapping part where the first and second leads 1A and 1B overlap each other as viewed in side view. According to this construction, the mechanical strength of the semiconductor light emitting device 100 can be improved. The semiconductor light emitting device 100 according to this embodiment has the overlapping part where the first lead overlaps the extending part of the flange portion which is arranged along the end edge of the second end portion of the second lead as viewed in side view as shown in FIGS. 4 and 8. It is preferable that the flange portion include the overlapping part as discussed above. The reason is that the first and second exposed surfaces serving as the external electrodes of the semiconductor light emitting device are spaced at a certain interval away from each other in the resin package bottom surface while providing the lead frame with the overlapping part.

As discussed above, the coupling strength between the lead frame 1 and the resin package 2 can be increased by providing the flange portions 53 to the lead frame 1, and embedding the flange portions 53 in the resin package 2. Accordingly, the damage to the resin package 2 on the periphery of the lead frame 1 can be effectively prevented. In particular, in the case where the flange portion 53 is provided along the side edge 1c and the end edge of the second end portion 15 of the second lead 1B as shown in FIG. 8, the damage to the resin package on the periphery of the second lead 1B can be more effectively prevented.

In the semiconductor light emitting device 100, a pair of second end portions 15 are provided in the second exposed surface 52 of the second lead 1B as shown in FIG. The thickness of the second end portion 15 is equal to the lead connection part 18. The lower surface of the second end portion 15 is exposed from the bottom surface 2a of the resin package 2. According to this construction, since the thickness of the tapering second end portion 15 is equal to the thickness of other parts of the lead frame 1, the mechanical strength of the second end portion 15 can be high.

(Frame Unit 6)

Figure 10:
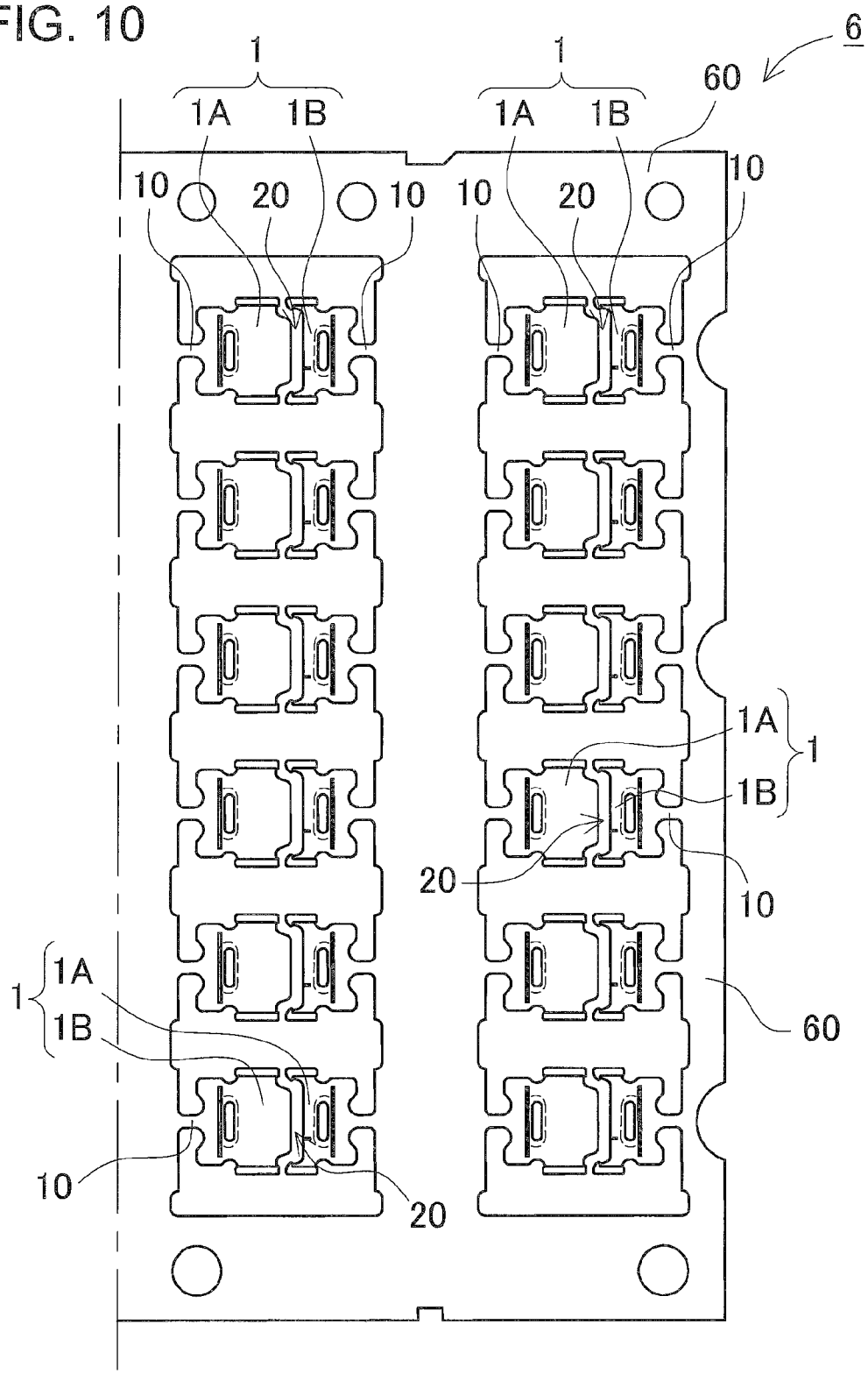
FIG. 10 is a schematic plan view of an exemplary frame unit.
Figure 11:
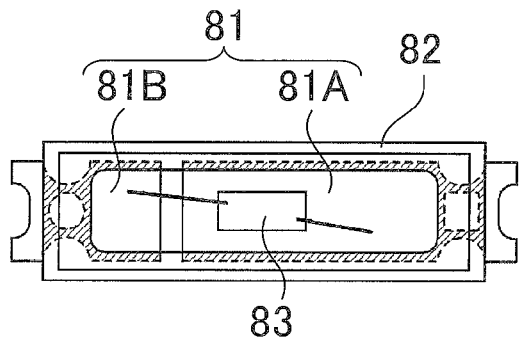
FIG. 11 is a schematic plan view showing the outline of a semiconductor light emitting device of Related Art.
Figure 12:
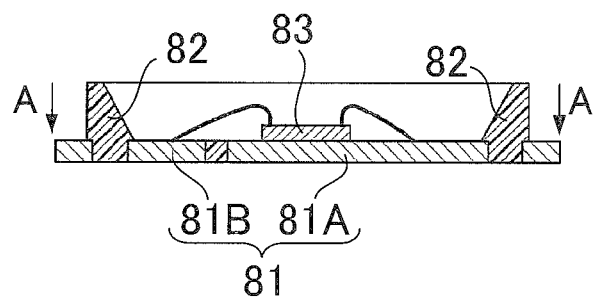
FIG. 12 is a schematic vertical cross-sectional view of the semiconductor light emitting device shown in FIG. 11.
Figure 13:
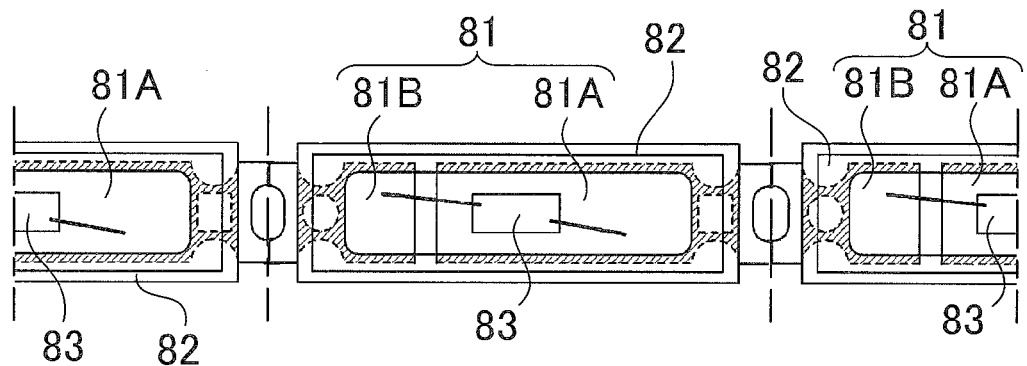
FIG. 13 is a schematic plan view showing a production process of the semiconductor light emitting device shown in FIG. 11.
Figure 14:
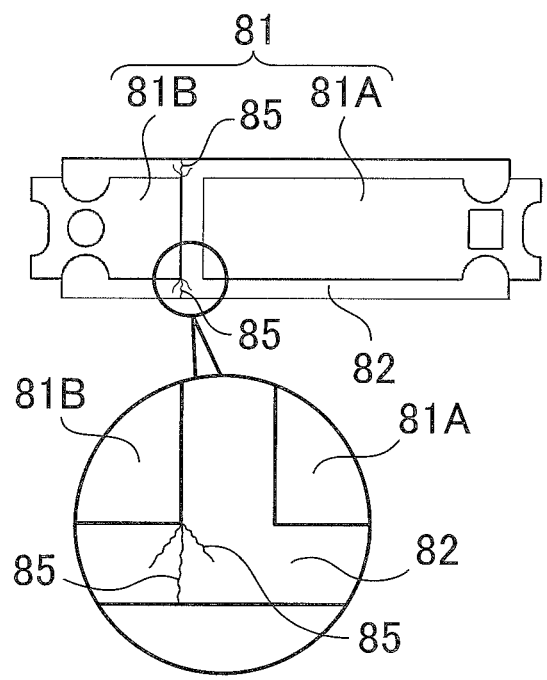
FIG. 14 shows a schematic bottom view including a partially enlarged bottom view of the semiconductor light emitting device shown in FIG. 11 with its resin package having a crack.

The lead frame 1 is covered by the resin package 2 with the first and second leads 1A and 1B being arranged in a predetermined position in a resin formation process that is one of the production processes. In order to arrange the first and second leads 1A and 1B in the predetermined position, the both ends of the lead frame 1 (i.e., the outside ends of the first and second leads 1A and 1B) are coupled to the frame-shaped lead runner 60 through the lead connection portions 10 in the resin formation process. FIG. 10 is a plan view showing one production process of the semiconductor light emitting device 100 according to a first embodiment in which the frame unit 6 includes a plurality of lead frames 1 coupled to the lead runner 60 through the lead connection portions 10.

The frame unit 6 shown in FIG. 10 is formed from an electrically-conductive metal plate into a predetermined pattern for providing the lead frames 1 which are arranged in rows and coupled to the lead runner 60. More specifically, the illustrated frame unit 6 is formed from the metal plate by die-cutting, or the like so that the lead frames 1 branch through the lead connection portions 10 from the frame-shaped lead runner 60. The first and second leads 1A and 1B are positioned by coupling the first and second leads 1A and 1B to the frame-shaped lead runner 60 through the lead connection portions 10 in the illustrated frame unit 6. After the resin package 2 for covering the lead frame 1 is formed with the first and second leads 1A and 1B being coupled to the lead runner 60 through the lead connection portions 10, the first and second leads 1A and 1B are arranged in the predetermined position in the resin package 2.

A plurality of semiconductor light emitting devices 100 are formed on the frame unit 6 of the lead frames 1 by production processes as discussed below. After that, the lead frames 1 are separated from the lead runner 60 by cutting the lead connection portions 10 so that the semiconductor light emitting devices 100 are cut from the lead runner in the cutting process. According to this frame unit 6 which includes a plurality of lead frames 1, a number of semiconductor light emitting devices 100 can be efficiently produced. In the frame unit 6 shown in FIG. 10, a plurality of the lead frames 1 are arranged in rows and coupled to the lead runner 60. More specifically, the lead frames 1 are arranged in a matrix. However, the arrangement of a plurality of lead frames in the frame unit is not limited to this. A plurality of lead frames may be arranged in one row in the frame unit. Also, a single lead frame may be coupled to the lead runner. Since the lead frames 1 each of which is composed of the first and second leads 1A and 1B are coupled to the lead runner 60 through the lead connection portions 10, these lead frames 1 can be handled as a single unit through the lead runner 60. Therefore, the workability can be improved.

(Resin Package 2)

The resin package 2 is formed in a predetermined shape for partially covering surfaces of the lead frame 1. The resin package 2 shown in FIG. 3 formed in a block which has a rectangular shape as viewed in plan view. Its four corners are rounded. The block-like resin package 2 partially covers the first and second leads 1A and 1B, which face each other. The covered parts of the first and second leads 1A and 1B serve as the inner lead sections 11 and 12, respectively. The outer lead sections 13 of the first and second leads 1A and 1B protrude from the both end surfaces of the resin package 2. The side surfaces of the resin package 2 that meet the end surfaces from which the outer leads 13 protrude serve as covering surfaces from which the lead frame 1 is not exposed. The resin package 2 has the opening 21 which opens in the central part of its upper surface so as to have a recessed shape as viewed in cross-sectional view. The lead central part 17 of the first lead 1A, and the lead connection part 18 of the second lead 1B are exposed in the bottom surface of this opening 21. Also, the resin package 2 includes a frame portion 22 that surrounds the opening 21. The frame portion 22 covers the resin coupling part 14 of the lead frame 1, and the both side edges of the lead central part 17 of the first lead 1A and the lead connection part 18 of the second lead 1B. The resin package 2 shown in FIGS. 2, 3, and 6 covers the second end portion 15 of the second lead 1B so that the second intermediate portion 18A is exposed in the bottom surface of the opening 21, and the first intermediate portion 17A of the first lead 1A and parts of the recessed parts 16 are exposed in the bottom surface of the opening 21.

As for the opening 21 of the resin package 2, the semiconductor light emitting elements 3 are mounted in the substantially central part of the bottom surface of the opening 21. From this viewpoint, the size of the bottom surface of the opening 21 is preferably specified to be able to mount one or more semiconductor light emitting elements 3 on the upper surface of the lead central part 17 of the first lead 1A, and electrically connect the conductive wires 32 to the first and second leads 1A and 1B. Also, the volume of the opening 21 is specified in consideration of the angle for reflection of light from the semiconductor light emitting elements 3 inward of the opening 21, and light chromaticity distribution, as well as the amounts and types of the sealing member 4 with which the opening 21 is filled and a phosphor that is contained in the sealing member 4, and the like. For this reason, the shape, size, and volume of the opening are not specifically limited.

The frame portion 22 of the resin package 2 covers the resin coupling parts 14 of the lead frame 1 so that the lead frame 1 is held in the predetermined position. In addition, the frame portion 22 of the resin package 2 covers the both side edges of the lead central part 17 of the first lead 1A, and the lead connection part 18 of the second lead 1B whereby increasing the coupling strength. In particular, it is noted that the frame portion 22 covers the second end portions 15, which are arranged on the both side parts of the second lead 1B. According to this construction, since the second end portions 15 of the second lead 1B are supported by the frame portion 22, the damage to the facing edge of the second lead 1B can be effectively prevented.

The lower surface 1a of the lead frame 1 is exposed from the illustrated resin package 2. According to this construction, the lower surface 1a of the lead frame 1 serves as the external terminal, and can be electrically connected to the external terminal. In addition, the heat dissipation effect can be improved by the exposed lower surface 1a of the lead frame 1.

The resin package 2 is a member that serves to fasten the lead frame in the predetermined position, and reflect light from the semiconductor light emitting elements off its reflector surface (interior walls of the opening). Examples of materials of the resin package can be provided by thermoplastic resins such as aliphatic polyamide resin, semi-aromatic-polyamide resin, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin and polyarylate resin, and thermosetting resins such as epoxy resin, modified epoxy resin, silicone resin, modified silicone resin, polybismaleimide triazine resin, polyimide resin and polyurethane resin. In terms of heat history in the production process, thermosetting resins are preferably used. The reason is that they are thermally and chemically resistant materials. In particular, epoxy resin or the modified epoxy resin, for example, EMC (Epoxy Molding Compound) can be suitably used. On the other hand, thermosetting resins become often hard after cured, and are relatively likely to be cracked or broken as compared with the thermoplastic resin. For this reason, the construction according to the embodiment of the invention is very effective particularly in this case.

In addition, the resin package can contain a light reflection member such as titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite, and the like in its resin material. In particular, in the case where the resin package has the recessed opening, the light extraction efficiency can be improved by using high reflective materials for the resin package.

Examples of methods for forming the resin package 2 can be provided by casting, injection molding, extrusion, presswork, and the like. The method for forming the resin package can be suitably selected in consideration of the resin material, the characteristics of the lead frame to be covered by the resin package, the shape of the resin package to be formed, and the like.

(Semiconductor Light Emitting Device 3)

Light emitting diodes and semiconductor lasers can be used as the semiconductor light emitting elements 3. The semiconductor light emitting elements 3 can be suitably formed of semiconductors such as ZnS, SiC, GaN, GaP, InN, AlN, ZnSe, GaAsP, GaAlAs, InGaN, GaAlN, AlInGaP, and AlInGaN deposited as a light-emitting layer on the substrate by liquid phase epitaxy, HDVPE, MOCV, and the like. The light emission wavelength of the semiconductor light emitting element 3 can be variously selected from ultraviolet light to infrared light by selecting the materials and the crystal mixture ratio of semiconductor. In particular, a nitride semiconductor is preferably used for the material of the light emitting element for emitting a high intensity of green or blue light. For example, $In_xAl_yGa_{1-x-y}N$ ($0 \leq x \leq 1$, $0 \leq y \leq 1$, $x+y \leq 1$), and the like can be used as the material of the light emitting layer.

The semiconductor light emitting elements 3 are mounted on the upper surface of the lead frame 1 that is exposed from the resin package in the bottom surface of the opening 21 of the resin package 2 as shown in FIGS. 1 and 2. The semiconductor light emitting elements 3 are arranged at predetermined positions in the lead central part 17 of the first lead 1A, and mounted by a bonding material. For example, in the case where the light emitting elements are formed of nitride group semiconductor layers deposited on a sapphire substrate, and emit blue or green light, an epoxy resin, silicone, and the like can be used as the bonding material. Also, in terms of degradation of the bonding material caused by light and heat from the light emitting elements, the back surface of the light emitting element can be plated with a metal such as Al. Alternatively, solder such as Au—Sn eutectic solder, wax such as low melting point metal may be used as the bonding material without using resin. In the case where the light emitting element includes the electrodes which are formed on its top and bottom surfaces, for example, in the case of a light emitting element which is formed of GaAs and the like, and emits red light, the light emitting element can be bonded by an electrically conductive paste such as silver, gold, and palladium, and the like.

(Electrically Conductive Wire 32)

In addition, the semiconductor light emitting device 100 includes the electrically conductive wires 32 for connecting the semiconductor light emitting elements 3 to the lead frame. More specifically, a pair of electrodes which are formed on the semiconductor light emitting element 3 are electrically connected to the lead frame by the electrically conductive wires 32 for supplying electric power supply to the light emitting element. The material, diameter, and the like of the electrically conductive wire 32 are not specifically limited. Any wires which are generally used in the art can be used as the electrically conductive wire 32. In particular, it is preferable that the electrically conductive wire 32 form good ohmic contact or good mechanical bonding with the electrode of the light emitting element, or have high electrical and thermal conductivities.

The electrically conductive wire 32 can be a wire made of a material containing a metal such as gold, silver, copper, platinum and aluminum, or an alloy of any of them. Also, the electrically conductive wire 32 can be the wire of which the surface is coated with silver or a silver alloy. In particular, in the case a high reflective material is required, it is preferable that silver, copper, lead, aluminum, platinum, or an alloy of any of them be selected. More preferably, silver or a silver alloy is selected. Although the diameter of the wire is not specifically limited, the diameter of the wire can typically fall within the range from approximately 10 to 70 µm. The diameter of the wire can preferably fall within the range from approximately 15 to 50 µm, more preferably approximately from 18 to 30 µm.

(Protection Element 5)

In addition, the semiconductor light emitting device 100 shown in FIG. 2 includes a protection element 5 that is mounted on the part of the lead frame 1 that is exposed in the opening 21 of the resin package 2. The protection element 5 prevents damage to the semiconductor light emitting element 3 if a reverse voltage is applied. A Zener diode 5A can be suitably used as the protection element 5 which is connected in approximately parallel to the semiconductor light emitting elements 3 so that the forward voltage direction of the Zener diode is opposite to the forward voltage direction of the semiconductor light emitting elements.

(Sealing Member 4)

The opening 21 of the resin package 2 is filled with the sealing member 4 for sealing the semiconductor light emitting elements 3, the electrically conductive wires 32, the protection element 5, and the like whereby protecting them from dust, smoke, moisture, external force, and the like. The opening 21 of the resin package 2 is filled with the sealing member 4, for example, by potting whereby closing the opening 21. Also, the opening may be sealed by injection molding with thermoplastic resin, or by transfer molding with thermosetting resin.

The sealing member 4 is preferably made of an electrically insulating material that is transmissive to the light that is emitted from the semiconductor light emitting elements. Examples of the material of the sealing member can be provided by epoxy resin, modified epoxy resin, silicone resin, modified silicone resin, phenol resin, polycarbonate resin, acrylate resin, TPX resin, polynorbornene resin, and hybrid resin containing one or more types of these resins. Especially, it is preferable to use silicone resin or epoxy resin. The sealing resin is not limited to an organic material. A high light resistant inorganic material such as glass and silica gel may be used. The sealing resin can be formed in a desired shape on the light outgoing side to provide a lens effect. In this case, light from the semiconductor light emitting elements can be focused or diverged. Specifically, the sealing member can have a convex lens shape, a concave lens shape, an ellipse shape as viewed from the light observation surface side, or a combination shape of two or more types of these shapes.

(Wavelength Conversion Member)

The sealing member 4 can include a wavelength conversion member. In this case, light from the semiconductor light emitting elements 3 can be into light with different wavelength whereby emitting mixed-color light by mixing the light of the semiconductor light emitting element 3 with the light with the converted wavelength, which is converted by the wavelength conversion A phosphor that can be excited by light emitted by the semiconductor light emitting elements 3 can suitably used as the wavelength conversion member. Examples of the phosphor can be provided by a nitride group phosphor and a nitride oxide group phosphor that are mainly activated by lanthanoide group elements such as europium and cerium, more specifically, by α- and β-SIALON phosphors, and various types of alkaline earth metal silicate nitride phosphors that are activated by europium. Other examples of the phosphor can be provided by alkaline earth metal halogen apatite phosphor, alkaline earth halosilicate phosphor, alkaline earth metal silicate phosphor, alkaline earth metal halogen borate phosphor, alkaline earth metal aluminate phosphor, alkaline earth metal silicate, alkaline earth metal sulfide, alkaline earth metal thiogallate, alkaline earth metal silicon nitride, germanate that are mainly activated by lanthanoide group elements such as europium and transition metal group elements such as manganese. Also, other examples of the phosphor can be provided by rare earth aluminate and rare earth silicate that are mainly activated by lanthanoid group elements such as cerium. Still other examples of the phosphor can be provided by organic substance, organic complex, and the like that are mainly activated by lanthanoid group elements such as europium. In particular, YAG (Yttrium Aluminum Garnet) group phosphors can be suitably used together with blue light emitting elements so that the semiconductor light emitting device can emit white light. In addition, KSF, or the like can be used as a red phosphor. Any phosphor other than the phosphors can be suitably used which has similar performance and effects.

The phosphor is not necessarily included in the sealing member. An additional process may be provided for forming a phosphor layer containing the phosphor on the surface of the light emitting element. In this case, the process forming the phosphor layer is not specifically limited. For example, spraying, electrodeposition, or electrostatic painting can be used. Alternatively, a phosphor sheet, or the like may be adhered to the semiconductor light emitting element. Such a phosphor sheet can be formed of a material of resin with a phosphor that is dispersed in the resin. Also, luminophors such as so-called nanocrystal or quantum dots may be used as the phosphor. Examples of the luminophor materials can be provided by highly dispersed nanosized particles of a semiconductor material, such as II-VI group, III-V group or IV-VI group semiconductors, more specifically, CdSe, core/shell type $CdS_xSe_{1-x}/ZnS$, GaP, and InAs. The particle diameter of typical such luminophors can fall within the range from 1 to 100 nm, preferably from approximately 1 to 20 nm (approximately ten to fifty atoms), for example. In the case where such luminophors are used, internal diffusion can be suppressed, and the scattering of the color-converted light can be suppressed. As a result, the light transmissivity can be further improved.

Also, organic group luminophor materials may be used as the phosphor. Typical examples of organic group luminophor material can be provided by luminophor materials including an organometallic complex, which often have high transparency. For this reason, in the case where organic group luminophor materials are used as the phosphor, there is a similar effect to quantum dot phosphors.

In addition, the sealing member 4 may suitably include suitable members such as light diffusion agent, and pigment depending on uses of the semiconductor light emitting device. Examples of the members can be provided by silica, titanium oxide, aluminum oxide, zirconium oxide, magnesium oxide, magnesium carbonate, magnesium hydroxide, calcium carbonate, calcium hydroxide, calcium silicate, zinc oxide, barium titanate, iron oxide, chrome oxide, manganese oxide, glass, carbon black, and mixtures that contains at least one of them. In this case, the semiconductor light emitting device can have good directivity. Similarly, various types of coloring agents can be added as a filter material which provides a filter effect for cutting off external entering light and light with unnecessary wavelength from the semiconductor light emitting element.

(Production Method of Semiconductor Light Emitting Device)

The semiconductor light emitting device 100 is produced by the following processes.

[Lead frame Preparation Process]

The metal plate is formed into the predetermined shape by die-cutting so that the lead frame 1 constructed of the first and second leads 1A and 1B is prepared. The lead frames 1 are formed as the frame unit 6, and the both ends of the lead frames 1 are coupled to the lead runner 60 through the lead connection portions 10 without completely separated from the lead runner 60 as shown in FIG. 10. The facing parts of the first and second leads 1A and 1B are spaced at the predetermined interval away from each other so that the insulation gap 20 is provided between them. The first and second leads 1A and 1B after die-cutting have the predetermined shape shown in FIG. 8. As for the first and second leads 1A and 1B, the first lead 1A is longer than the second leads 1B in the length direction of the lead frame 1. The second end portions 15 are formed by extending the corner parts of the second lead 1B that face the first lead 1A toward the first lead 1A. The peripheral edge of the second end portion 15 is rounded. In addition, the first lead 1A has the recessed parts 16 that face the second end portions 15 of the second leads 1B in the both side parts of the first lead that face the second lead 1B. It is preferable that a plurality of lead frames 1 be coupled to the lead runner 60. The lead frames 1 are arranged in matrix in the frame unit 6 shown in FIG. 10. In the case where a plurality of lead frames 1 are included in the single frame unit 6, the semiconductor light emitting devices can be efficiently produced in a high-volume production manner.

[Resin Formation Process]

The resin package 2 is formed by covering the parts of surfaces of the lead frame 1 formed in the lead frame preparation process by resin. In the resin formation process, a hollow cavity of a heating mold having a predetermined inner surface shape is filled with fluid intermediate resin with the first and second leads 1A and 1B being arranged in the predetermined position in the cavity so that the resin package 2 is formed by casting. After the resin is cured by heating, or the like, the formed resin package 2 is removed from the cavity. In the resin formation process, the resin package 2 is formed into the shape having the opening 21 in the central part of the frame portion 22 for covering the lead frame 1 so that the lead frame 1 is exposed in the bottom surface of this opening 21, and the both ends of the lead frame 1 extend outward of the both end surfaces of the frame portion 22.

[Mounting Process of Semiconductor Light Emitting Element]

The semiconductor light emitting element 3 is mounted by the bonding member onto the mount surface 19 of the first lead 1A, which is exposed from the bottom surface of the opening 21 of the resin package 2, as shown in FIG. 2. The illustrated semiconductor light emitting device 100 includes six semiconductor light emitting elements 3. The semiconductor light emitting elements 3 are mounted in the predetermined positions of the lead central part 17 of the first lead 1A, which is located in the central parts of the opening 21. In addition, the electrically conductive wires 32, which are connected to the p-side and n-side electrodes of the mounted semiconductor light emitting element 3, are connected to the lead central part 17 of the first lead 1A, and the lead connection part 18 of the second lead 1B.

[Mounting Process of Protection Element 5]

In addition, the protection element 5 is mounted on the exposed part of the lead frame 1, which is exposed in the bottom surface of the opening 21 of the resin package 2 as shown in FIG. 2. The illustrated protection element 5 is the Zener diode 5A, and is connected in approximately parallel to the semiconductor light emitting elements 3 so that the forward voltage direction of the Zener diode is opposite to the forward voltage direction of the semiconductor light emitting elements.

[Filling Process of Sealing Member 4]

The opening 21 of the resin package 2 is filled with the sealing member 4 as shown in FIG. 1. The sealing member 4 seals the semiconductor light emitting elements 3 and the protection elements 5, which are mounted on the upper surface of the lead frame 1. The sealing member 4 can be formed from a light transmissive resin, and preferably from a light transmissive thermosetting resin. The opening 21 of the resin package 2 is filled with the sealing member 4 by potting method.

[Cutting Process of Lead Connection Portion 10]

The semiconductor light emitting devices 100 are separated from the lead runner 60 by cutting the lead connection portions 10 on the both ends of the lead frames 1. The lead connection portion 10 is cut at the position that is slightly retracted from the end surface of the external lead protruding part 13a as shown by the dashed line in FIGS. 3 to 6. Thus, a cut surface 10A of the lead connection portion 10 is formed inside the end surface of the external lead protruding part 13a. This construction can effectively prevent the edge of the cut surface 10A from damaging other semiconductor light emitting device.

Figure 5:
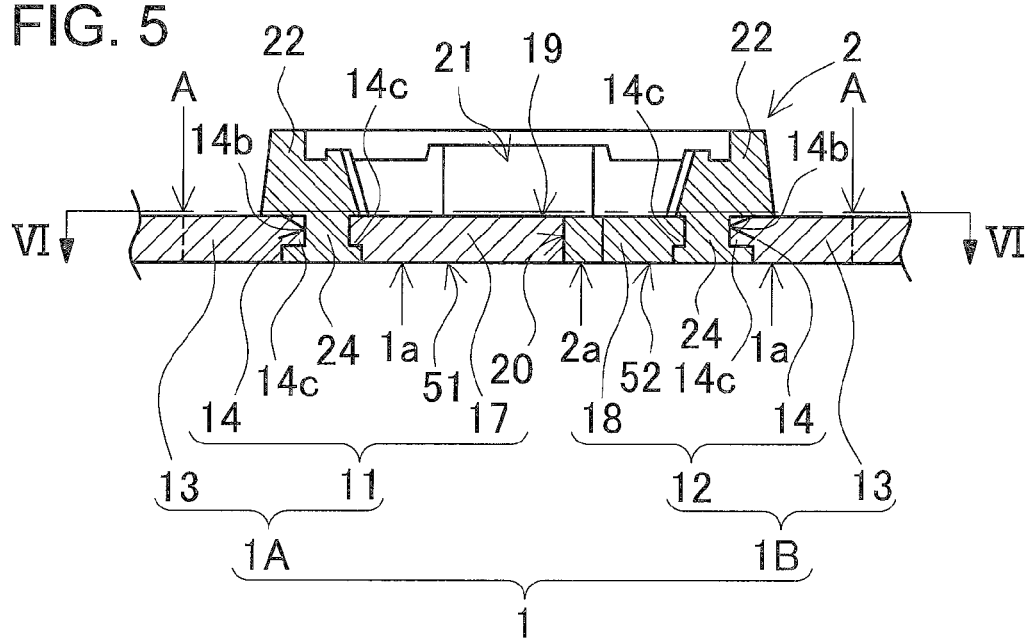
FIG. 5 is a schematic cross-sectional view showing the lead frame and the resin package shown in FIG. 3 taken along the line V-V.

As shown in FIG. 5, when a shearing force as shown by the arrow A is applied to the cutting position, the stress is likely to act on the facing edge, which is located on the first lead 1A, of the second lead 1B, which is shorter than the first lead 1A, in the cutting process of the lead connection portion 10. To address this, the second lead 1B includes the second end portions 15, which are arranged on its corner parts that face the first lead 1A. This construction can effectively suppress the stress to be concentrated on the part of the second lead that faces the first lead 1A. Consequently, it is possible to reduce the risk that the resin package is damaged by a shock when the lead connecting portion 10 is cut.

A semiconductor light emitting device according to the present invention can be applied to a lighting, an LED display, a back light source, a signal light, an illuminated switch, various types of sensors and indicators, and the like.

What is claimed is:

1. A semiconductor light emitting device comprising:
a lead frame having a mount surface and a bottom surface;
a semiconductor light emitting element that is mounted on said lead frame mount surface; and
a resin package that partially covers said lead frame and has a bottom surface, a first end surface, and a second end surface that is opposite to said first end surface,
wherein said lead frame comprises a first lead and a second lead that are arranged along a facing direction so as to face each other at facing surfaces in said resin package,
wherein said first lead forms a first lead exposed surface in the lower surface thereof, said first lead exposed surface being exposed from said resin package bottom surface in a substantially coplanar manner, and said second lead forms a second lead exposed surface in the lower surface thereof, said second lead exposed surface being exposed from said resin package bottom surface in a substantially coplanar manner,
wherein said first lead is longer than second lead in said facing direction, and said semiconductor light emitting element is mounted on the upper surface of said first lead,
wherein said second lead includes a pair of second end portions in said second exposed surface, said second end portions extending from the both ends of said facing surface thereof toward said first lead in tapered shape with a rounded edge point,
wherein said first lead includes a first inner lead section that is covered by said resin package, and a first outer lead section that extends from said first inner lead section and protrudes from said resin package first end surface,
wherein said second lead includes a second inner lead section that is covered by said resin package, and a second outer lead section that extends from said second inner lead section and protrudes from said resin package second end surface,
wherein each of said first outer lead section and said second outer lead section meets continuously with said lead frame bottom surface,
wherein said resin package has third and fourth surfaces that are opposite and meet with said first and second end surfaces, and
wherein said lead frame is not exposed from said resin package third and fourth surfaces.

2. The semiconductor light emitting device according to claim 1, wherein side surfaces of said resin package that meet the end surfaces of said resin package from which said outer leads of said first lead and said second lead are covering surfaces in which said lead frame is non-exposed.

3. The semiconductor light emitting device according to claim 1, wherein said first lead has a pair of first end portions formed at both ends of the facing surface of said first lead, each of said first end portions being defined corresponding to said second end portion.

4. The semiconductor light emitting device according to claim 3, wherein said second lead includes a second intermediate portion between said pair of second end portions, said second intermediate portion formed substantially flat, and
said first lead includes a first intermediate portion between said pair of first end portions, said first intermediate portion formed substantially flat.

5. The semiconductor light emitting device according to claim 4, wherein said resin package has an opening to expose the upper surface of said lead frame to mount said semiconductor light emitting element on said mount surface, and
wherein said second end portions of said second leads are covered with said resin package, and said second intermediate portion is exposed in the bottom surface of said opening.

6. The semiconductor light emitting device according to claim 4, wherein said resin package has an opening to expose the upper surface of said lead frame to mount said semiconductor light emitting element on said mount surface, and
wherein said first intermediate portion and said first end portions of said first lead are exposed in the bottom surface of said opening.

7. The semiconductor light emitting device according to claim 1, wherein said resin package has an opening on the upper surface side that is recessed as viewed in section so as to expose the upper surface of said lead frame from the resin package in the bottom surface of said opening,
wherein the upper surface of said lead frame serves as said mount surface for said semiconductor light emitting element, and
wherein said semiconductor light emitting element is mounted on said first lead in the central part of said opening.

8. The semiconductor light emitting device according to claim 1, wherein said first lead partially overlaps said second lead as viewed in side view.

9. The semiconductor light emitting device according to claim 1, wherein said first lead and said second lead include a first flange portion and a second flange portion on their side edges respectively, and
wherein said first and second flange portions are covered with said resin package.

10. The semiconductor light emitting device according to claim 9, wherein said second flange portion extends along the contour at least around the edge of the second end portion.

11. The semiconductor light emitting device according to claim 1, wherein said second end portion forms inclined surface at facing side each other so as to increase the distance therebetween.

12. The semiconductor light emitting device according to claim 1, wherein one side of said second lead is extended toward said first end portion to partially form said second end portion.

13. The semiconductor light emitting device according to claim 1, wherein each of said first lead exposed surface and said second lead exposed surface continuously extends from said inner lead section to said outer lead section, respectively.

14. The semiconductor light emitting device according to claim 1, wherein said first lead exposed surface and said second lead exposed surface are coplanar with said resin package bottom surface.

15. The semiconductor light emitting device according to claim 1, further comprising a protection element for protecting said semiconductor light emitting element mounted on said second lead.

* * * * *